United States Patent
Hong et al.

(10) Patent No.: US 8,507,788 B2
(45) Date of Patent: Aug. 13, 2013

(54) SOLAR CELL PANEL

(75) Inventors: Jongkyoung Hong, Seoul (KR);
Jongdae Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/957,635

(22) Filed: Dec. 1, 2010

(65) Prior Publication Data

US 2011/0139211 A1    Jun. 16, 2011

(30) Foreign Application Priority Data

Aug. 9, 2010 (KR) .................. 10-2010-0076286

(51) Int. Cl.
*H01L 31/00*     (2006.01)

(52) U.S. Cl.
USPC .................. 136/256; 136/244; 136/251

(58) Field of Classification Search
USPC ........................................... 136/261
See application file for complete search history.

(56) References Cited

U.S. PATENT DOCUMENTS

| | | | | |
|---|---|---|---|---|
| 2004/0154658 A1* | 8/2004 | Tanaka et al. | ................. | 136/256 |
| 2007/0095387 A1* | 5/2007 | Fujii et al. | .................... | 136/251 |
| 2007/0186968 A1* | 8/2007 | Nakauchi et al. | ............. | 136/244 |
| 2007/0235077 A1* | 10/2007 | Nagata et al. | ................. | 136/256 |
| 2007/0295381 A1* | 12/2007 | Fujii et al. | ...................... | 136/244 |
| 2008/0121265 A1* | 5/2008 | Hishida et al. | ................ | 136/244 |
| 2011/0048526 A1 | 3/2011 | Ishida et al. | | |

FOREIGN PATENT DOCUMENTS

| | | |
|---|---|---|
| JP | 8-298334 A | 11/1996 |
| JP | 9-283785 A | 10/1997 |
| KR | 10-2010-0043473 A | 4/2010 |
| WO | WO 2009/130949 A1 | 10/2009 |

* cited by examiner

*Primary Examiner* — Miriam Berdichevsky
(74) *Attorney, Agent, or Firm* — Birch, Stewart, Kolasch & Birch, LLP

(57) ABSTRACT

A solar cell panel is discussed. The solar cell panel includes a plurality of solar cells, each solar cell including a substrate and a second electrode positioned on a second surface of the substrate that is opposite a first surface of the substrate; a first conductive adhesive film including a first resin and a plurality of first conductive particles dispersed in the first resin, the first conductive adhesive film being positioned on a second surface of the second electrode that is opposite a first surface of the second electrode that contacts the substrate, and a first surface of the first conductive adhesive film that faces the second electrode entirely contacting at least one of the second surface of the second electrode and the second surface of the substrate; and an interconnector positioned on a second surface of the first conductive adhesive film that is opposite the first surface of the first conductive adhesive film.

19 Claims, 10 Drawing Sheets

FIG. 14 though not required, a diameter of each of the plurality of first conductive particles may be equal to or less than a thickness of the at least one first portion.

SOLAR CELL PANEL

This application claims priority to and the benefit of Korean Patent Application No. 10-2010-0076286 filed in the Korean Intellectual Property Office on Aug. 9, 2010, the entire contents of which are incorporated herein by reference.

BACKGROUND OF THE INVENTION

1. Field of the Invention

Example embodiments of the invention relate to a solar cell panel in which adjacent solar cells are electrically connected to one another using an interconnector.

2. Description of the Related Art

Solar power generation to convert light energy into electric energy using a photoelectric transformation effect has been widely used as a method for obtaining eco-friendly energy. A solar power generation system using a plurality of solar cell panels has been installed in places, such as houses due to an improvement in a photoelectric transformation efficiency of solar cells.

The solar cell panel includes an interconnector for electrically connecting a plurality of solar cells to one another, front and back protective members for protecting the solar cells, and a sealing member that is positioned between the front and back protective members to seal the solar cells.

SUMMARY OF THE INVENTION

In one aspect, there is a solar cell panel including a plurality of solar cells, an interconnector electrically connecting the plurality of solar cells to one another, and a first conductive adhesive film positioned between the interconnector and a substrate of at least one solar cell. Each of the plurality of solar cells includes a substrate and a second electrode positioned on a second surface of the substrate that is opposite a first surface of the substrate. The first conductive adhesive film includes a first resin and a plurality of first conductive particles dispersed in the first resin. The first conductive adhesive film is positioned on a second surface of the second electrode that is opposite a first surface of the second electrode that contacts the substrate, and a first surface of the first conductive adhesive film that faces the second electrode entirely contacts at least one of the second surface of the second electrode and the second surface of the substrate. The interconnector is positioned on a second surface of the first conductive adhesive film that is opposite the first surface of the first conductive adhesive film. The interconnector is electrically connected to the second electrode through the plurality of first conductive adhesive film.

The second electrode includes aluminum. More specifically, the second electrode may be formed using an aluminum paste including an aluminum powder, a bismuth-based glass frit, and an organic vehicle. The aluminum powder has a middle diameter equal to or less than about 10 μm in a particle distribution based on a laser diffraction method. The bismuth-based glass frit contains bismuth oxide as an essential component and has a glass softening temperature equal to or less than about 580° C.

The second electrode includes at least one first portion directly contacting the first surface of the first conductive adhesive film and at least one second portion adjacent to the at least one first portion.

A thickness of the at least one first portion may be different from or substantially equal to a thickness of the at least one second portion.

When the thickness of the at least one first portion is different from the thickness of the at least one second portion, and the thickness of the at least one first portion is less than the thickness of the at least one second portion.

If an oxide layer and/or impurities exist at the surface of the second electrode including the aluminum, the first conductive adhesive film may not be sufficiently attached to the second electrode. Thus, surface processing of the at least one first portion of the second electrode may be performed so as to remove the oxide layer and/or the impurities. The thickness of the at least one first portion may be less than the thickness of the at least one second portion because of the surface processing.

A width of the first conductive adhesive film may be equal to or less than a width of the at least one first portion. In this instance, the first conductive adhesive film does not contact the at least one second portion. Alternatively, a width of the first conductive adhesive film may be greater than a width of the at least one first portion. In this instance, the first conductive adhesive film directly contacts a portion of the at least one second portion. Instead of the surface processing of the at least one first portion of the second electrode, the surface processing of the entire second electrode, i.e., the at least one first portion and the at least one second portion may be performed. In this instance, the thickness of the at least one first portion is substantially equal to the thickness of the at least one second portion.

The surface processing of the second electrode may be performed through a cleansing process using a gas (for example, an air or an inert gas such as nitrogen gas), pure water or a grinding process using a roller.

When the second electrode includes a high density aluminum layer and a low density aluminum layer, the low density aluminum layer may be removed through the surface processing.

When the low density aluminum layer is removed, a second surface field layer may be efficiently formed during the firing of the aluminum paste. Further, a bowing phenomenon of the substrate may be prevented or reduced.

A length of the at least one first portion may be different from or substantially equal to a length of the at least one second portion.

When the length of the at least one first portion is different from the length of the at least one second portion, it is preferable, but not necessary, that the length of the at least one first portion is shorter than the length of the at least one second portion. When the length of the at least one first portion is shorter than the length of the at least one second portion, a length of the first conductive adhesive film is longer than the length of the at least one first portion. Hence, at least one end of the first conductive adhesive film may extend to an outside of the at least one first portion and may directly contact the substrate.

The plurality of first conductive particles may directly contact at least one of the at least one first portion and the interconnector. The first resin may be positioned between the plurality of first conductive particles and the at least one first portion of the second electrode and between the plurality of first conductive particles and the interconnector.

The plurality of first conductive particles may be electrically connected to one another. Because a current may smoothly flow when carriers moving to the second electrode moves through the plurality of first conductive particles.

The plurality of first conductive particles may directly contact at least one of the at least one first portion and the interconnector, so as to efficiently transfer carriers moving to the second electrode to the interconnector. Preferably, but not required, the plurality of first conductive particles may directly contact each of the at least one first portion and the interconnector.

Each solar cell may further include an emitter layer positioned on a first surface of the substrate, a first electrode electrically connected to the emitter layer, and an anti-reflection layer positioned on the emitter layer on which the first electrode is not positioned.

A second conductive adhesive film is positioned on a first surface of the first electrode. The interconnector electrically connected to the second electrode of the adjacent solar cell is positioned on a first surface of the second conductive adhesive film. The second conductive adhesive film includes a second resin and a plurality of second conductive particles dispersed in the second resin.

The first electrode includes a first portion directly contacting the second conductive adhesive film and a second portion not contacting the second conductive adhesive film.

The first and second portions of each of the plurality of first electrodes may have the same width. The first and second portions of at least one of the plurality of first electrodes may have different widths.

When a width of the first portion is different from a width of the second portion, the width of the first portion may be greater than the width of the second portion. Hence, an adhesive strength between the second conductive adhesive film and the first electrode is improved, and a contact resistance between the second conductive adhesive film and the first electrode decreases. As a result, an output reduction is prevented or reduced.

The first portion has a predetermined length in a longitudinal direction of the first electrode, and the length of the first portion may be equal to or less than a width of the second conductive adhesive film.

A portion of the second conductive adhesive film directly contacts the anti-reflection layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 1:
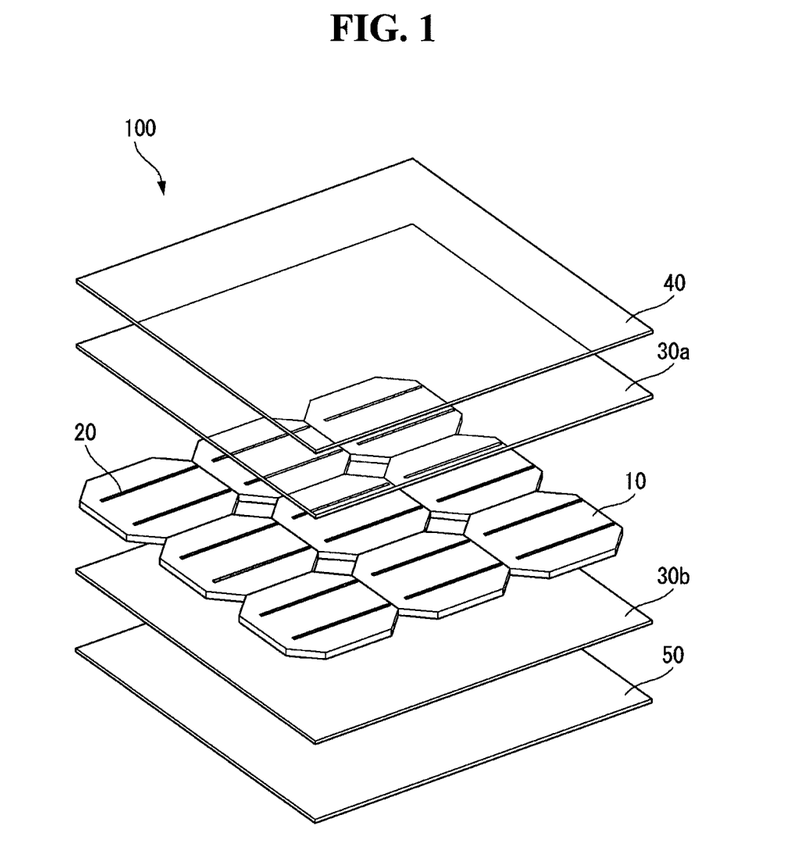
FIG. 1 is an exploded perspective view of a solar cell panel according to an embodiment of the invention.
Figure 2:
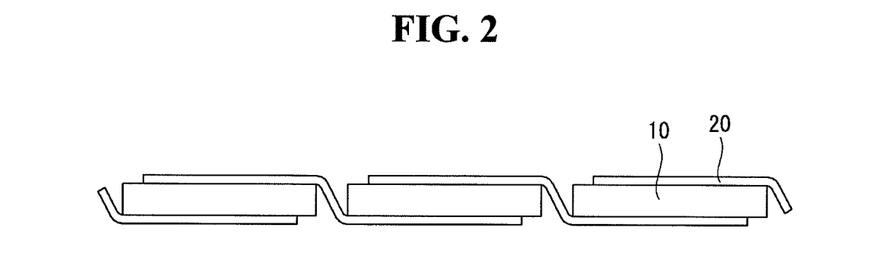
FIG. 2 schematically illustrates an electrical connection structure between a plurality of solar cells of a solar cell panel.

FIG. 1 is an exploded perspective view of a solar cell panel according to an embodiment of the invention. FIG. 2 schematically illustrates an electrical connection structure between a plurality of solar cells of the solar cell panel.

As shown in FIGS. 1 and 2, a solar cell panel 100 according to an example embodiment of the invention includes a plurality of solar cells 10, interconnectors 20 for electrically connecting the solar cells 10 to one another, front and back protective layers (or first and second protective layers) 30a and 30b for protecting the solar cells 10, a transparent member 40 positioned on the front protective layer 30a on light receiving surfaces of the solar cells 10, and a back sheet 50 underlying the back protective layer 30b on surfaces opposite the light receiving surfaces of the solar cells 10.

The back sheet 50 prevents moisture or oxygen from penetrating into a back surface (or a second surface) of the solar cell panel 100, thereby protecting the solar cells 10 from an external environment. The back sheet 50 may have a multi-layered structure including a moisture/oxygen penetrating prevention layer, a chemical corrosion prevention layer, a layer having insulating characteristics, etc.

In a double-sided light receiving solar cell, a glass or a resin having a light transparency may be used instead of the back sheet 50.

The front and back protective layers 30a and 30b and the solar cells 10 form an integral body when a lamination process is performed in a state where the front and back protective layers 30a and 30b are respectively positioned on front surfaces and back surfaces (or first and second surfaces) of the solar cells 10. The front and back protective layers 30a and 30b prevent corrosion of metal resulting from the moisture penetration and protect the solar cells 10 from an impact. The front and back protective layers 30a and 30b may be formed of a material such as ethylene vinyl acetate (EVA). Other materials may be used.

The transparent member 40 on the front protective layer 30a is formed of a tempered glass having a high light transmittance and excellent damage prevention characteristic. The tempered glass may be a low iron tempered glass containing a small amount of iron. The transparent member 40 may have an embossed inner surface so as to increase a scattering effect of light.

As shown in FIG. 1, the plurality of solar cells 10 is arranged in a matrix structure. Although FIG. 1 illustrates that the solar cells 10 on the back protective layer 30b have a structure of a 3×3 matrix, the number of solar cells 10 in row and/or column directions may vary, if necessary or desired.

As shown in FIG. 2, the plurality of solar cells 10 are electrically connected to one another using the interconnectors 20. More specifically, an electrode part (or first electrode part) formed on a front surface of one solar cell 10 is electrically connected to an electrode part (or a second electrode part) formed on a back surface of another solar cell 10 adjacent to the one solar cell 10 using an interconnector 20 in a state where the plurality of solar cells 10 are positioned adjacently to one another.

Figure 3:
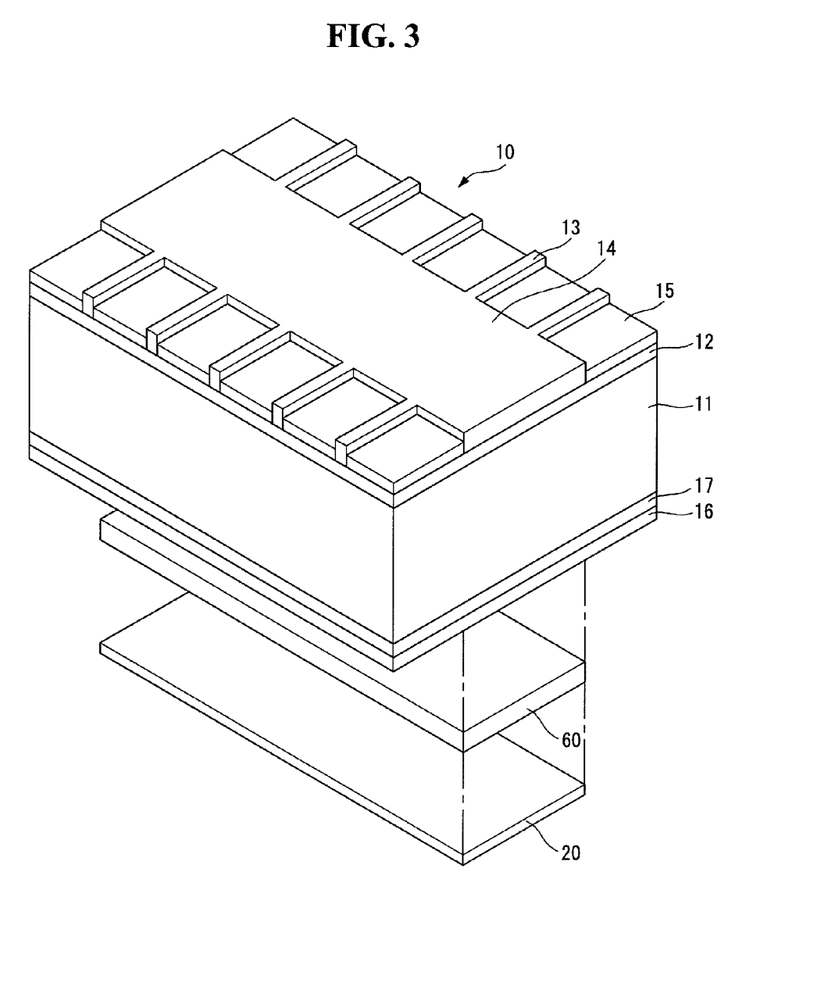
FIG. 3 is an exploded perspective view illustrating a configuration of a solar cell in a solar cell panel according to a first example embodiment of the invention.
Figure 4:
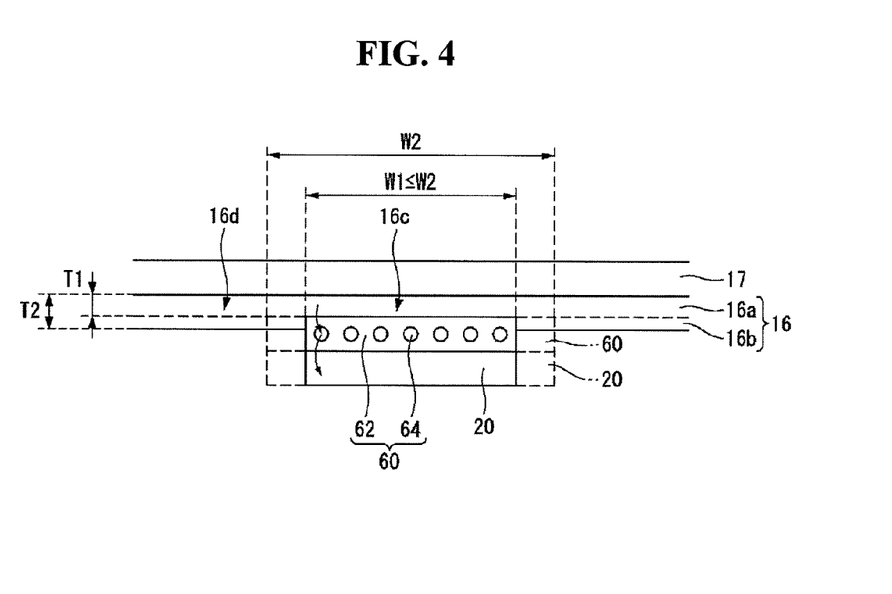
FIG. 4 is a cross-sectional view illustrating an assembly configuration of the solar cell in the solar cell panel shown in FIG. 3.
Figure 5:
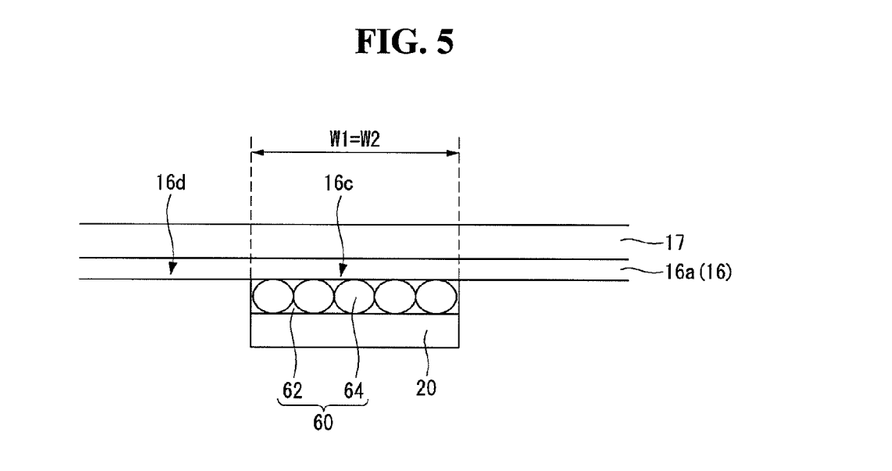
FIG. 5 is a cross-sectional view illustrating another assembly configuration of the solar cell in the solar cell panel shown in FIG. 3.

FIG. 3 is an exploded perspective view illustrating a configuration of a solar cell in a solar cell panel according to a first example embodiment of the invention. FIG. 4 is a cross-sectional view illustrating an assembly configuration of the solar cell in the solar cell panel shown in FIG. 3. FIG. 5 is a cross-sectional view illustrating another assembly configuration of the solar cell in the solar cell panel shown in FIG. 3.

As shown in FIG. 3, the solar cell 10 includes a substrate 11, an emitter layer 12 positioned at a front surface (for example, a light receiving surface on which light is incident) of the substrate 11, a plurality of front electrodes (or first electrodes) 13 positioned on the emitter layer 12, a front electrode current collector (or first electrode current collector) 14 that is positioned on the emitter layer 12 to cross the front electrodes 13, an anti-reflection layer 15 positioned on the emitter layer 12 on which the front electrodes 13 and the front electrode current collector 14 are not positioned, and a back electrode (or a second electrode) 16 positioned on a surface (i.e., a back surface) opposite the light receiving surface of the substrate 11.

The solar cell 10 further includes a back surface field (BSF) layer 17 between the back electrode 16 and the substrate 11. The back surface field layer 17 is a region (e.g., a p$^+$-type region) that is more heavily doped with impurities of the same conductive type as the substrate 11 than the substrate 11. The back surface field layer 17 serves as a potential barrier of the substrate 11. Thus, because the back surface field layer 17 prevents or reduces a recombination and/or a disappearance of electrons and holes around the back surface of the substrate 11, the efficiency of the solar cell 10 is improved.

The substrate 11 is a semiconductor substrate, which may be formed of first conductive type silicon, for example, p-type silicon, though not required. Silicon used in the substrate 11 may be single crystal silicon, polycrystalline silicon, or amorphous silicon. When the substrate 11 is of a p-type, the substrate 11 contains impurities of a group III element such as boron (B), gallium (Ga), and indium (In).

The surface of the substrate 11 may be textured to form a textured surface corresponding to an uneven surface or having uneven characteristics having a plurality of uneven portions. When the surface of the substrate 11 is the textured surface, a light reflectance in the light receiving surface of the substrate 11 is reduced. Further, because both a light incident operation and a light reflection operation are performed on the textured surface of the substrate 11, light is confined in the solar cell 10. Hence, a light absorption increases, and the efficiency of the solar cell 10 is improved. In addition, because a reflection loss of light incident on the substrate 11 decreases, an amount of light incident on the substrate 11 further increases.

The emitter layer 12 is a region doped with impurities of a second conductive type (for example, an n-type) opposite the first conductive type of the substrate 11. The emitter layer 12 forms a p-n junction along with the substrate 11. When the emitter layer 12 is to be of the n-type, the emitter layer 12 may be formed by doping the substrate 11 with impurities of a group V element such as phosphor (P), arsenic (As), and antimony (Sb).

When energy of light incident on the substrate 11 is applied to the semiconductors of the substrate 11, carriers (e.g., electron-hole pairs) are produced inside the semiconductors, and electrons move to the n-type semiconductor and holes move to the p-type semiconductor. Thus, when the substrate 11 is of the p-type and the emitter layer 12 is of the n-type, the holes move to the p-type substrate 11 and the electrons move to the n-type emitter layer 12.

Alternatively, the substrate 11 may be of an n-type and/or may be formed of semiconductor materials other than silicon. When the substrate 11 is of the n-type, the substrate 11 may contain impurities of a group V element such as phosphorus (P), arsenic (As), and antimony (Sb).

Because the emitter layer 12 forms the p-n junction along with the substrate 11, the emitter layer 12 is of the p-type when the substrate 11 is of the n-type. In this instance, electrons move to the n-type substrate 11 and holes move to the p-type emitter layer 12.

When the emitter layer 12 is of the p-type, the emitter layer 12 may be formed by doping a portion of the substrate 11 with impurities of a group III element such as boron (B), gallium (Ga), and indium (In).

The anti-reflection layer 15 on the emitter layer 12 may be formed of silicon nitride (SiNx), silicon dioxide (SiO$_2$), or titanium dioxide (TiO$_2$). The anti-reflection layer 15 reduces a reflectance of light incident on the solar cell 10 and increases a selectivity of a predetermined wavelength band of the incident light, thereby increasing the efficiency of the solar cell 10. The anti-reflection layer 15 may have a thickness of about 70 nm to 80 nm. The anti-reflection layer 15 may be omitted, if desired.

The plurality of front electrodes 13 on the emitter layer 12 are electrically and physically connected to the emitter layer 12 and are formed in one direction in a state where the adjacent front electrodes 13 are spaced apart from one another. Each of the front electrodes 13 collects carriers (e.g., electrons) moving to the emitter layer 12. Each of the front electrodes 13 is formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used for the front electrodes 13.

For example, the front electrodes 13 may be formed of an Ag paste containing lead (Pb). In this instance, the front electrodes 13 may be electrically connected to the emitter layer 12 by way of a process in which the Ag paste is coated on the anti-reflection layer 15 using a screen printing method and the substrate 11 is fired at a temperature of about 750° C. to 800° C. The electrical connection between the front electrodes 13 and the emitter layer 12 is performed by etching the anti-reflection layer 15 using the lead (Pb) contained in the Ag paste during the firing process and which then brings Ag particles of the Ag paste into contact with the emitter layer 12.

The front electrode current collector 14 may be formed of the same material as the front electrodes 13 using the same method as the front electrodes 13.

The back electrode 16 is formed on the surface (i.e., the back surface of the substrate 11) opposite the light receiving surface of the substrate 11. The back electrode 16 collects carriers (e.g., holes) moving to the substrate 11. The back electrode 16 is formed of at least one conductive material. The conductive material may be at least one selected from the group consisting of Ni, Cu, Ag, Al, Sn, Zn, In, Ti, Au, and a combination thereof. Other conductive materials may be used.

When the back electrode 16 is formed of aluminum (Al), the back electrode 16 may be formed by coating and firing an aluminum paste.

The aluminum paste used may include an aluminum powder, a bismuth-based glass fit, and an organic vehicle. The aluminum powder has a middle diameter D50 equal to or less than 10 μm in a particle distribution based on a laser diffraction method. The bismuth-based glass frit contains bismuth oxide as an essential component and has a glass softening temperature equal to or less than 580° C.

The aluminum powder refers to an aggregate of particles containing aluminum as the main component and may contain a small amount of impurities other than aluminum.

The middle diameter D50 refers to a diameter when a cumulative volume is 50% in a particle distribution of the corresponding powder. The middle diameter D50 may be easily measured using various particle distribution measuring devices based on the laser diffraction method.

It is preferable, but not necessary, that particles constituting the aluminum powder have a sphere shape. However, the particles constituting the aluminum powder may have other shapes such as a flake shape and/or a non-uniform shape.

It is preferable, but not necessary, that an amount of the aluminum powder is about 65% to 85% based on the total amount of the aluminum paste, and an amount of bismuth oxide in the bismuth-based glass fit is equal to or more than about 40% based on the total amount of the bismuth-based glass frit.

Examples of the bismuth-based glass frit include a glass frit containing bismuth oxide, boron oxide ($B_2O_3$), and zinc oxide (ZnO) as the main component, a glass fit containing bismuth oxide, boron oxide ($B_2O_3$), and silicon oxide as the main component, and a glass fit containing bismuth oxide, silicon oxide, and lead oxide as the main component.

Further, the bismuth-based glass fit may further contain barium oxide (BaO) and silicon dioxide ($SiO_2$).

An amount of the bismuth-based glass frit may be about 1% to 10% based on the total amount of the aluminum paste.

The organic vehicle is not particularly limited as long as it can sufficiently disperse the aluminum powder and the bismuth-based glass fit. The organic vehicle may be used by combining ethylene glycol, diethylene glycol derivative (glycol ether-based derivative), one kind or several kinds of an organic solvent having a high boiling point such as toluene and xylene.

An amount of the organic vehicle may be about 10% to 30% based on the total amount of the aluminum paste.

The back electrode 16 may be manufactured or formed by applying the aluminum paste manufactured as discussed above to the back surface of the substrate 11, drying the applied aluminum paste at a proper temperature (for example, a room temperature or 100° C.), and heating (firing) the dried aluminum paste using a firing furnace under the proper heating conditions (for example, at about 700° C. to 800° C.). The back surface field layer 17 is formed simultaneously with the firing of the aluminum paste.

As shown in FIG. 4, when the back electrode 16 is manufactured using the aluminum paste, a high density aluminum layer 16a is formed on the surface of the substrate 11 and a low density aluminum layer 16b is formed on the surface of the high density aluminum layer 16a. Further, an aluminum oxide layer is formed on the surface of the low density aluminum layer 16b. Alternatively, impurities exist at the surface of the low density aluminum layer 16b.

When the aluminum oxide layer or the impurities exist at the surface of the back electrode 16, an adhesive strength generated when a first conductive adhesive film 60 to be described later is attached to the back electrode 16 may be reduced. Thus, before the first conductive adhesive film 60 is attached to the back electrode 16, the surface processing of the back electrode 16 may be performed.

The surface processing of the back electrode 16 may be performed through a cleansing process using a gas (for example, air or an inert gas such as nitrogen gas), pure water or a grinding process using a roller.

When the surface processing of the back electrode 16 is performed, the low density aluminum layer 16b may be removed along with the aluminum oxide layer or the impurities existing in the surface of the back electrode 16.

As shown in FIG. 2, the solar cells 10 each having the above-described configuration are electrically connected to one another using the interconnector 20.

More specifically, the first conductive adhesive film 60 is attached to the back electrode 16 on the back surface of the substrate 11.

The first conductive adhesive film 60 includes a first resin 62 and first conductive particles 64 dispersed in the first resin 62. A material of the first resin 62 is not particularly limited as long as it has the adhesive property. It is preferable, but not necessary, that a thermosetting resin is used for the first resin 62 so as to increase an adhesive reliability. The thermosetting resin may use at least one selected among epoxy resin, phenoxy resin, acryl resin, polyimide resin, and polycarbonate resin.

The first resin 62 may further contain a predetermined material, for example, a known curing agent and a known curing accelerator other than the thermosetting resin. For example, the first resin 62 may contain a reforming material such as a silane-based coupling agent, a titanate-based coupling agent, and an aluminate-based coupling agent, so as to improve an adhesive strength between the back electrode 16 and the interconnector 20. The first resin 62 may contain a dispersing agent such as calcium phosphate and calcium carbonate, so as to improve the dispersibility of the first conductive particles 64. The first resin 62 may contain a rubber component such as acrylic rubber, silicon rubber, and urethane rubber, so as to control the modulus of elasticity of the first resin 62.

A material of the first conductive particles 64 is not particularly limited as long as it has the conductivity. The first conductive particles 64 may contain at least one metal selected among copper (Cu), silver (Ag), gold (Au), iron (Fe), nickel (Ni), lead (Pb), zinc (Zn), cobalt (Co), titanium (Ti), and magnesium (Mg) as the main component. The first conductive particles 64 need not be formed of only metal particles or metal-coated resin particles. The first conductive adhesive film 60 having the above-described configuration may include a peeling film.

It is preferable, but not necessary, that the first conductive particles 64 use the metal-coated resin particles, so as to mitigate a compressive stress on the first conductive particles 64 and improve a connection reliability of the first conductive particles 64. It is preferable, but not necessary, that the first conductive particles 64 have a diameter of 2 μm to 30 μm, so as to improve the dispersibility of the first conductive particles 64.

It is preferable, but not necessary, that a composition amount of the first conductive particles 64 dispersed in the first resin 62 is about 0.5% to 20% based on the total volume of the first conductive adhesive film 60 in consideration of the connection reliability after the first resin 62 is cured.

When the composition amount of the first conductive particles 64 is less than about 0.5%, a current may not smoothly flow because a physical contact area between the back electrode 16 and the first conductive adhesive film 60 decreases. When the composition amount of the first conductive particles 64 is greater than about 20%, the adhesive strength may be reduced because a composition amount of the first resin 62 relatively decreases.

The first conductive adhesive film 60 is attached to a portion of the back electrode 16. When a tabbing process is performed using the first conductive adhesive film 60, a heating temperature and a pressure are not particularly limited as long as they are within the range capable of securing an electrical connection and maintaining the adhesive strength.

For example, the heating temperature may be set to a temperature capable of curing the first resin 62, for example, about 150° C. to 180° C. The pressure may be set to a range capable of sufficiently attaching the back electrode 16 and the interconnector 20 to the first conductive adhesive film 60. Further, a heating and pressure time may be set to the extent that the back electrode 16, the interconnector 20, etc., are not damaged or deteriorated because of heat.

The back electrode 16 includes a first portion 16c attached to the first conductive adhesive film 60 and a second portion 16d adjacent to the first portion 16c. Thus, the first conductive adhesive film 60 directly contacts the first portion 16c of the back electrode 16. In other embodiments, the a first surface of the first conductive adhesive film 60 that faces the back electrode 16 entirely contacts at least one of the back surface of the back electrode 16 and the back surface of the substrate 11.

The interconnector 20 is attached to a back surface (or a second surface) of the first conductive adhesive film 60 attached to the first portion 16c of the back electrode 16 in the same direction as a formation direction of the first conductive adhesive film 60. A remaining portion (or an opposite end) of the interconnector 20 not attached to the first conductive adhesive film 60 is electrically connected to the front electrode current collector 14 of the adjacent solar cell 110.

In an embodiment, the first conductive adhesive film 60 is positioned between the back electrode 16 and the interconnector 20 without an intervening layer. Accordingly, the first conductive adhesive film 60 is directly attached to (or in contact with) the back electrode 16 and the interconnector 20.

As shown in FIG. 4, the first resin 62 may be positioned between the first conductive particles 64 and the back electrode 16 and between the first conductive particles 64 and the interconnector 20 in a state where the back electrode 16 is attached to the interconnector 20 using the first conductive adhesive film 60.

In this instance, carriers moving to the back electrode 16 jump to the first conductive particles 64 and then again jump to the interconnector 20. Thus, the carriers moving to the back electrode 16 move along an arrow as shown in FIG. 4 and then move to the interconnector 20.

In this instance, a distance between the first conductive particles 64 may be properly set. The distance between the first conductive particles 64 may be set by properly adjusting the number or the size of the first conductive particles 64 dispersed in the first resin 62.

Thus, the carriers moving to the back electrode 16 are transferred to the interconnector 20 through the first conductive particles 64.

Alternatively, as shown in FIG. 5, the first conductive particles 64 may directly contact one or both of the back electrode 16 and the interconnector 20 and/or to one another.

The first conductive particles 64 may be modified into an oval shape because of the pressure applied during the tabbing process. Thus, it is preferable, but not necessary, that a width of the first conductive adhesive film 60 is greater than a thickness of the first conductive adhesive film 60.

In the structure shown in FIG. 5, because the carriers moving to the back electrode 16 are directly transferred to the interconnector 20 through the first conductive particles 64, a current in the structure shown in FIG. 5 more smoothly flows than the structure shown in FIG. 4.

The surface processing of the back electrode 16 for removing the aluminum oxide layer and/or the impurities existing at the surface of the back electrode 16 may be performed on only the first portion 16c of the back electrode 16 attached to the first conductive adhesive film 60. The low density aluminum layer 16b on the surface of the high density aluminum layer 16a is removed along with the aluminum oxide layer and/or the impurities.

Thus, as shown in FIG. 4, the first portion 16c of the back electrode 16 is formed of only the high density aluminum layer 16a, and the second portion 16d of the back electrode 16 is formed of the high density aluminum layer 16a, the low density aluminum layer 16b, and the aluminum oxide layer. Therefore, a thickness T1 of the first portion 16c is less than a thickness T2 of the second portion 16d.

When the thickness T1 of the first portion 16c is less than the thickness T2 of the second portion 16d, a width W2 of the first conductive adhesive film 60 may be equal to or less than a width W1 of the first portion 16c as indicated by the solid line shown in FIG. 4 (i.e., W1≧W2). In the structure shown in FIG. 4, the first conductive adhesive film 60 directly contacts the first portion 16c, but does not directly contact the second portion 16d. In this instance, the width W2 of the first conductive adhesive film 60 may be equal to or greater than the width of the interconnector 20. Alternatively, the width W2 of the first conductive adhesive film 60 may be less than the width of the interconnector 20.

Further, the width W2 of the first conductive adhesive film 60 may be greater than the width W1 of the first portion 16c as indicated by the dotted line shown in FIG. 4 (i.e., W2>W1). In this instance, the width W2 of the first conductive adhesive film 60 may be equal to or greater than the width of the interconnector 20. Alternatively, the width W2 of the first conductive adhesive film 60 may be less than the width of the interconnector 20.

Because the aluminum oxide layer existing in the surface of the back electrode 16 is removed even if the back electrode 16 does not include the low density aluminum layer 16b, a slight thickness difference between the first and second portions 16c and 16d may be generated.

As shown in FIG. 5, when the surface processing is performed on the entire surface of the back electrode 16, both the first and second portions 16c and 16d are formed of only the high density aluminum layer 16a. Therefore, the first and second portions 16c and 16d have substantially the same thickness. In this instance, the width W2 of the first conductive adhesive film 60 is substantially equal to the width W1 of the first portion 16c (i.e., W1=W2).

Figure 6:
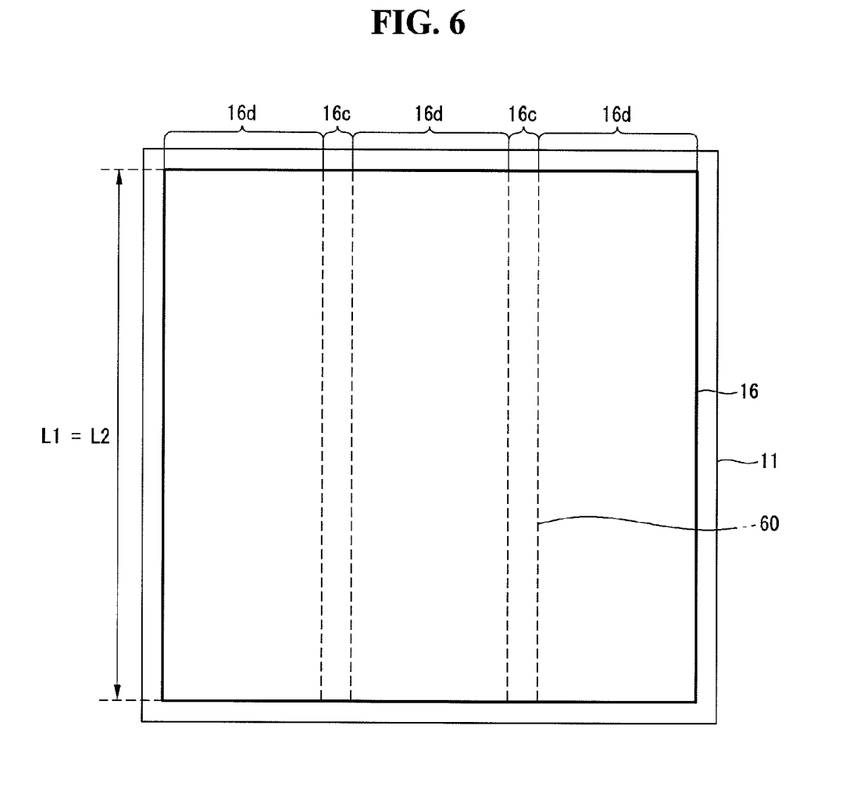
FIGS. 6 to 8 are plane views of a back surface of a substrate illustrating various configurations of a back electrode.

As shown in FIG. 6, the back electrode 16 may be formed on the entire back surface of the substrate 11 except an edge portion (or edge portions) of the substrate 11. In this instance, a length of the first conductive adhesive film 60 may be equal to, slightly shorter than, or slightly longer than a length L1 of the first portion 16c and a length L2 of the second portion 16d.

Figure 7:
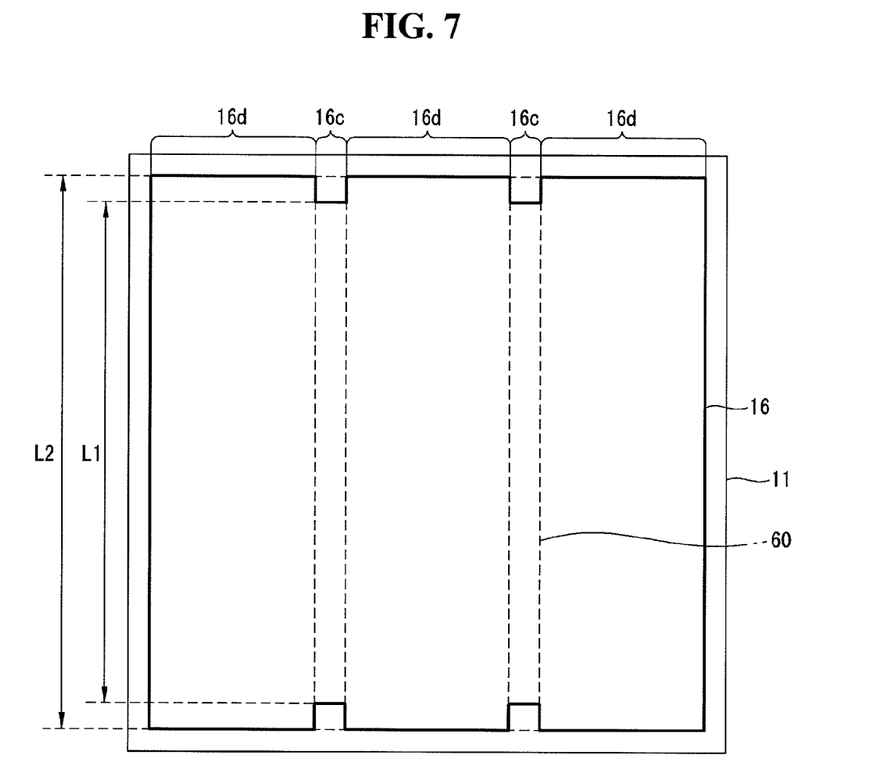

As shown in FIG. 7, the length L1 of the first portion 16c may be shorter than the length L2 of the second portion 16d.

In this instance, because the length of the first conductive adhesive film 60 is longer than the length L1 of the first portion 16c, the adhesive strength may increase by bringing at least one end of the first conductive adhesive film 60 into direct contact with the substrate 11 outside the first portion 16c. Further, the length of the first conductive adhesive film 60 may be substantially equal to the length L2 of the second portion 16d. Additionally, the length of the first conductive adhesive film 60 may be substantially equal to or shorter than the length L1 of the first portion 16c.

Figure 8:
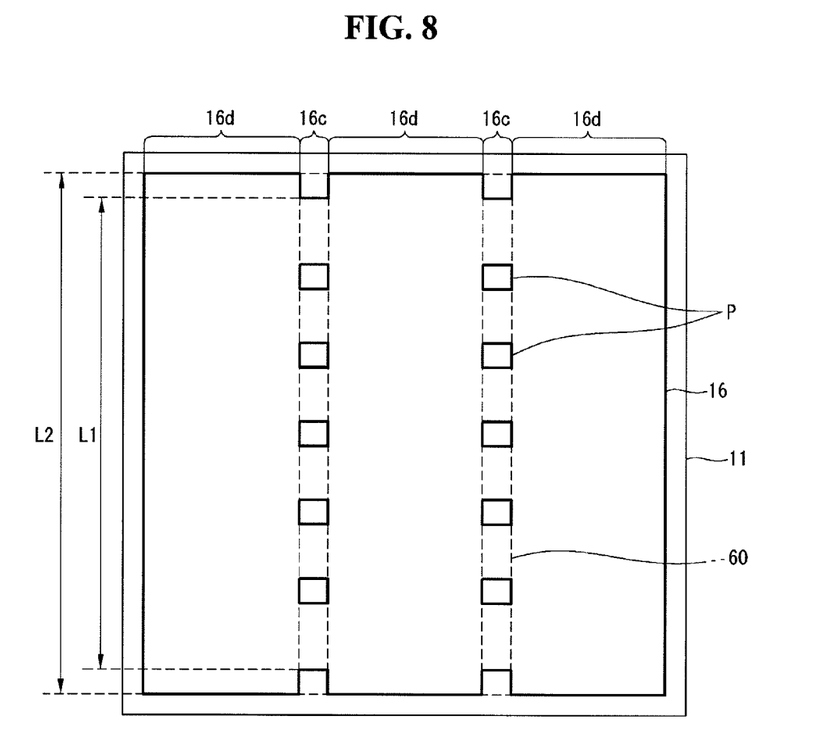

As shown in FIG. 8, hole patterns P exposing the substrate 11 may be formed in a portion of the first portion 16c of the back electrode 16. In the structure shown in FIG. 8, because the first conductive adhesive film 60 directly contacts the substrate 11 in the hole patterns P, the adhesive strength of the first conductive adhesive film 60 increases.

FIG. 8 shows the hole patterns P positioned parallel to one another in a row direction, i.e., in a transverse direction in FIG. 8. However, the hole patterns P need not be parallel to one another in the row direction and may be non-uniformly positioned.

In the structure shown in FIG. 8, carriers moving to the back electrode 16 are transferred to the interconnector through the first conductive particles of the first conductive adhesive film 60. Thus, because a back electrode current collector (or a second electrode current collector) for transferring the carriers moving to the back electrode 16 to the interconnector is not necessary, the process and the cost required to form the back electrode current collector may be reduced or eliminated.

Further, when the back electrode 16 is directly connected to the interconnector 20 using the first conductive adhesive film 60, the tabbing process may be performed at a low temperature, for example, at a temperature equal to or lower than 180° C. As discussed above, when the tabbing process is performed at the low temperature of equal to or lower than 180° C., a bowing phenomenon and a damage of the substrate may be prevented or reduced more sufficiently or readily than a bowing phenomenon and a damage of the substrate when the tabbing process is performed using soldering at a high temperature, for example, at a temperature equal to or higher than 220° C.

Further, because a flux is not used, the adhesive strength between the interconnector 20 and the back electrode 16 may be uniformly maintained, and a misalignment thereof may be prevented or reduced. Hence, an output reduction thereof may be prevented or reduced.

The tabbing process used to electrically connect the interconnector 20 electrically connected to the back electrode 16 to the front electrode current collector 14 of the adjacent solar cell may be performed by a soldering process using the flux in other embodiments.

A solar cell in solar cell panel according to a second example embodiment of the invention is described below with reference to FIGS. 9 to 14.

Since an electrode structure and a tabbing structure at a back surface of a substrate in the second example embodiment are substantially the same as the first example embodiment, a further description may be briefly made or may be entirely omitted. An electrode structure and a tabbing structure at a front surface of the substrate according to the second example embodiment are described below.

Figure 9:
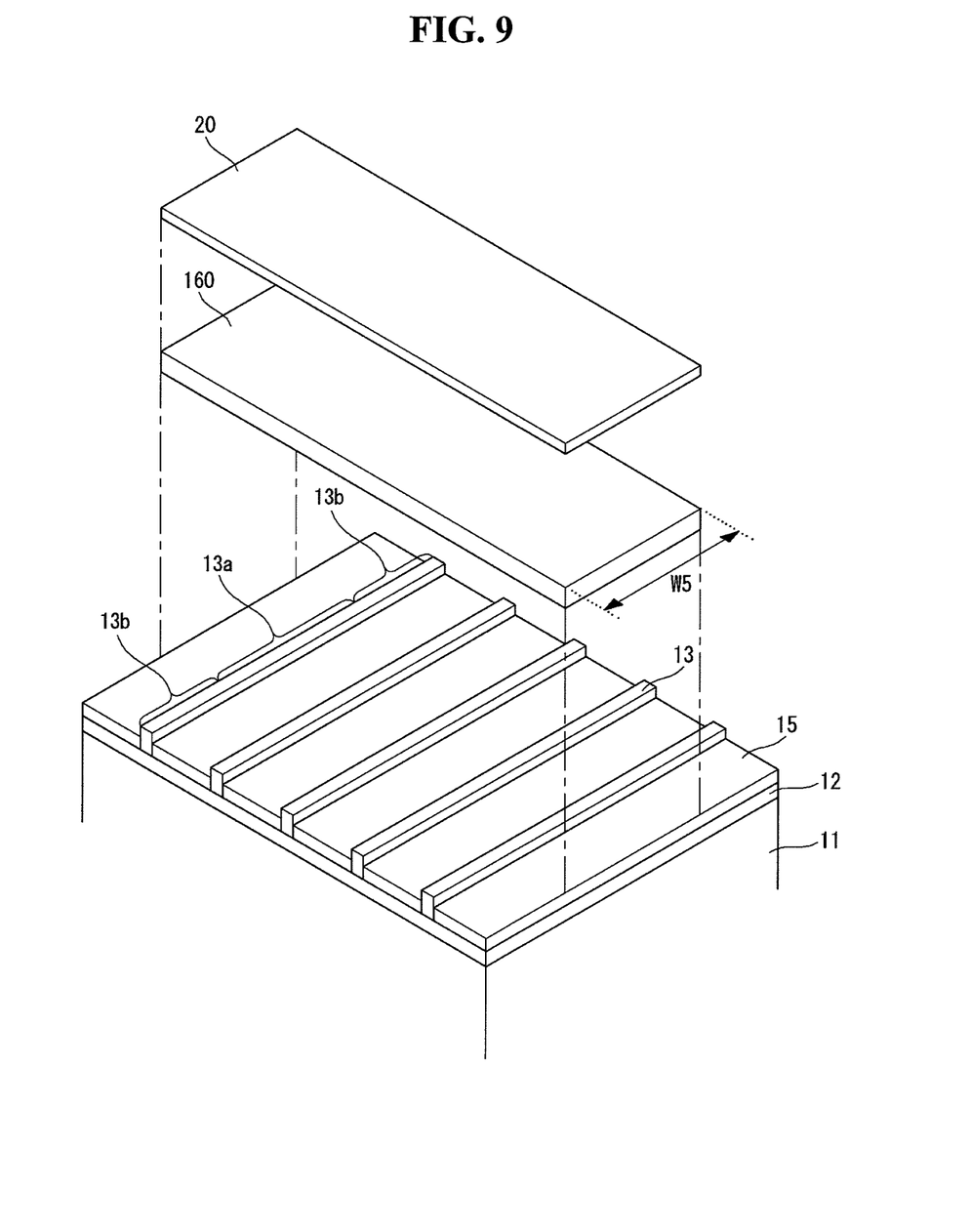
FIG. 9 is an exploded perspective view illustrating a configuration of a solar cell in a solar cell panel according to a second example embodiment of the invention.
Figure 10:
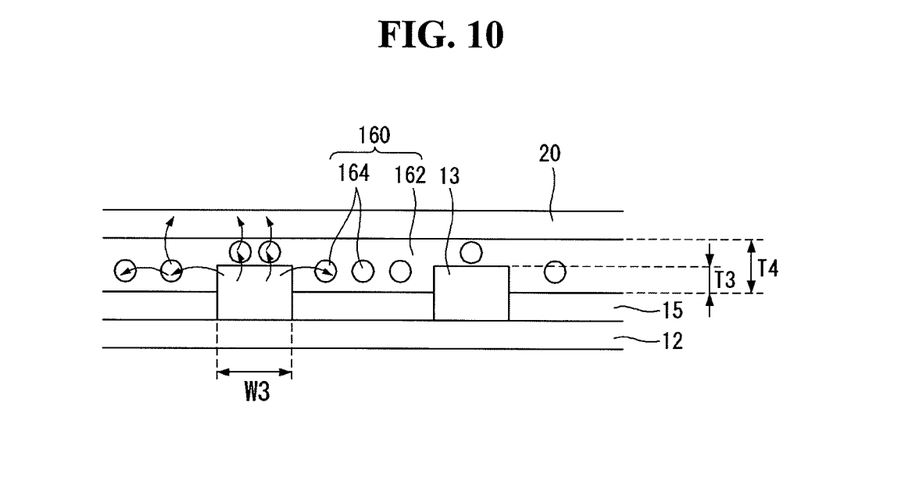
FIG. 10 is a cross-sectional view illustrating an assembly configuration of the solar cell in the solar cell panel shown in FIG. 9.
Figure 11:
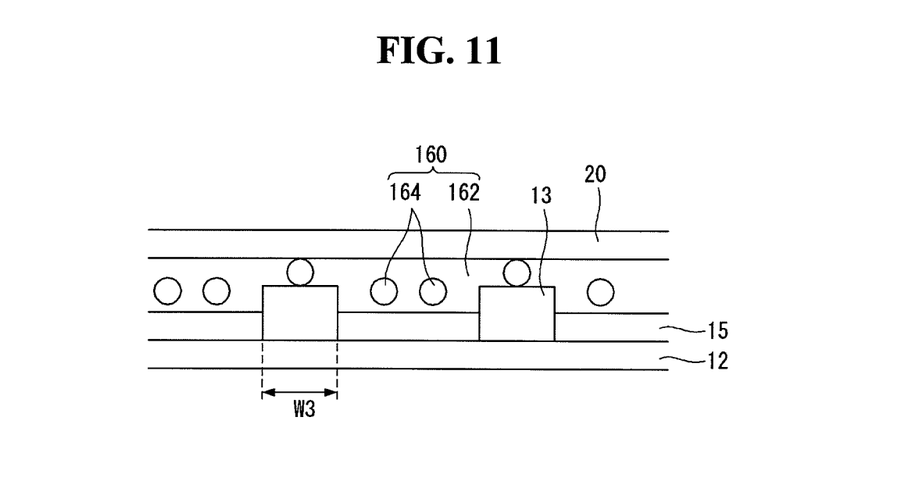
FIG. 11 is a cross-sectional view illustrating another assembly configuration of the solar cell of the solar cell panel shown in FIG. 9.
Figure 12:
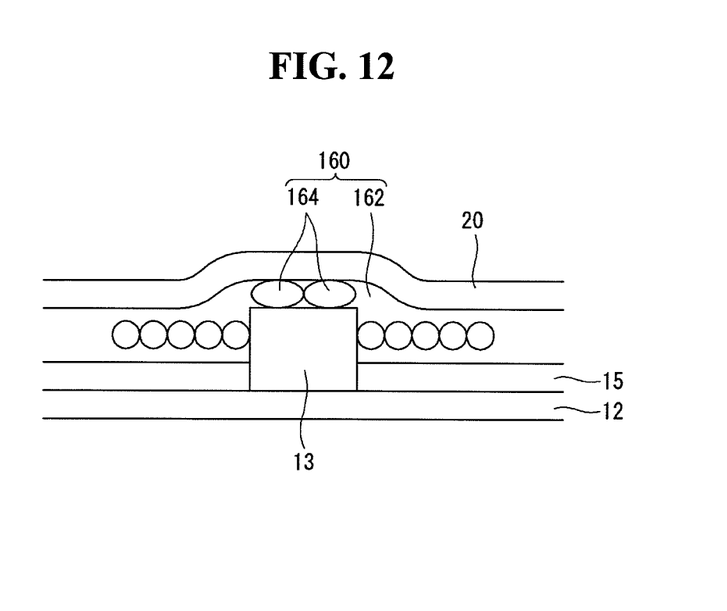
FIG. 12 is a cross-sectional view illustrating yet another assembly configuration of the solar cell panel shown in FIG. 9.
Figure 13:
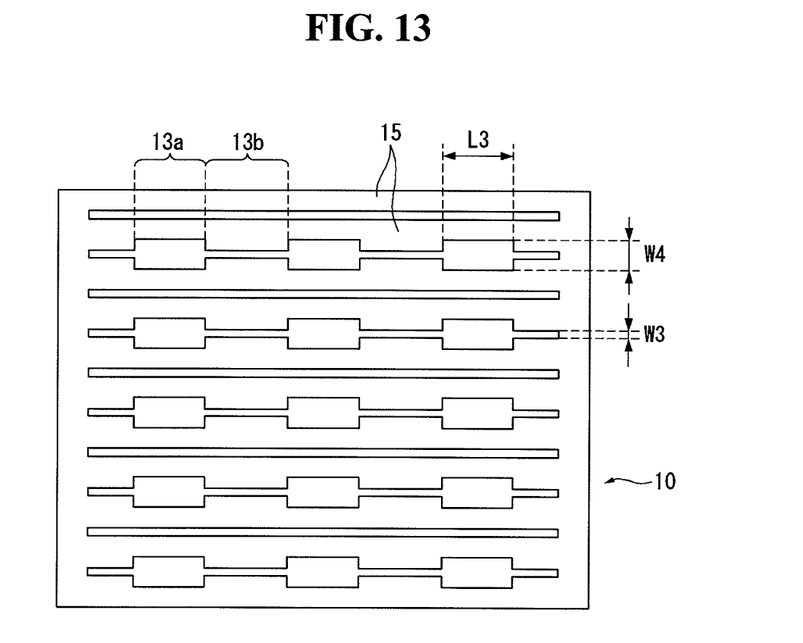
FIGS. 13 and 14 are plane views of a front surface of a substrate illustrating various configurations of a front electrode.
Figure 14:
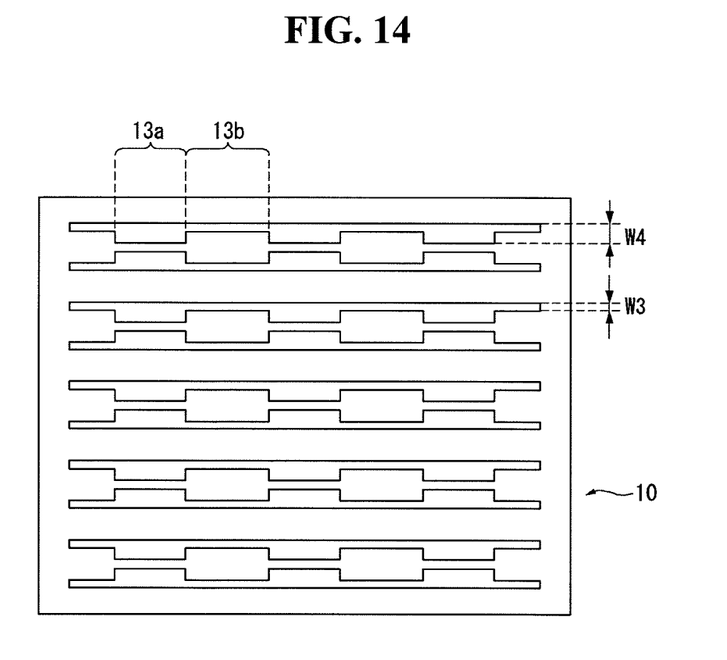

FIG. 9 is an exploded perspective view illustrating a configuration of the solar cell in the solar cell panel according to the second example embodiment of the invention. FIG. 10 is a cross-sectional view illustrating an assembly configuration of the solar cell in the solar cell panel shown in FIG. 9. FIG. 11 is a cross-sectional view illustrating another assembly configuration of the solar cell in the solar cell panel shown in FIG. 9. FIG. 12 is a cross-sectional view illustrating yet another assembly configuration of the solar cell in the solar cell panel shown in FIG. 9. FIGS. 13 and 14 are plane views of the front surface of the substrate illustrating various configurations of a front electrode.

Structures and components identical or equivalent to those described in the first and second example embodiments are designated with the same reference numerals, and a further description may be briefly made or may be entirely omitted.

As shown in FIG. 9, unlike the first example embodiment, only a plurality of front electrodes 13 are positioned on an emitter layer 12 of a substrate 11. In other words, the front electrode current collector is not formed in the second example embodiment.

A plurality of second conductive adhesive films 160 are positioned on a front surface of the substrate 11 in a direction crossing the front electrodes 13. Each of the plurality of second conductive adhesive films 160 includes a second resin 162 and second conductive particles 164 dispersed in the second resin 162. The second resin 162 may be formed of the same material as the first resin 62 of the first conductive adhesive film 60, and the second conductive particles 164 may be formed of the same material as the first conductive particles 64 of the first conductive adhesive film 60. Further, the second resin 162 may be formed of a material different from the first resin 62, and the second conductive particles 164 may be formed a material different from the first conductive particles 64 in other embodiments of the invention.

The second conductive adhesive film 160 is attached to a portion of each front electrode 13 in the direction crossing the front electrodes 13 through a process performed at a low temperature, for example, at a temperature equal to or lower than 180° C. Thus, a portion of the second conductive adhesive film 160 directly contacts the portions of the front electrodes 13, and a remaining portion of the second conductive adhesive films 160 directly contacts an anti-reflection layer 15.

Each front electrode 13 includes a first portion 13a attached to the second conductive adhesive film 160 and a second portion 13b not attached to the second conductive adhesive film 160.

An interconnector 20 is attached to a front surface (or a first surface) of the second conductive adhesive film 160 attached to the first portion 13a of the front electrode 13 in the same direction as a formation direction of the second conductive adhesive film 160. The interconnector 20 is the interconnector attached to the back electrode 16 of the adjacent solar cell using the first conductive adhesive film 60 in the first example embodiment.

In an embodiment, the second conductive adhesive film 160 is positioned between the front electrode 13 and the interconnector 20 without an intervening layer. Accordingly, the first conductive adhesive film 160 is directly attached to (or in contact with) the front electrode 13 and the interconnector 20.

As shown in FIG. 10, the second resin 162 may be positioned between the second conductive particles 164 and the front electrode 13 and between the second conductive particles 164 and the interconnector 20 in a state where the front electrodes 13 is attached to the interconnector 20 using the second conductive adhesive film 160.

In this instance, carriers moving to the front electrode 13 jump to the second conductive particles 164 and then again jump to the interconnector 20. Further, carriers jumping to the second conductive particles 164 may jump to the adjacent second conductive particles 164. Thus, the carriers moving to the front electrode 13 move along an arrow as shown in FIG. 10 and then move to the interconnector 20.

A distance between the second conductive particles 164 may be properly set so that carriers can jump between the adjacent second conductive particles 164. The distance between the second conductive particles 164 may be set by properly adjusting the number or the size of the second conductive particles 164 dispersed in the second resin 162.

Thus, the carriers moving to the front electrode 13 are transferred to the interconnector 20 through the second conductive particles 164.

Further, as shown in FIG. 11, the second conductive particles 164 may directly contact one or both of the front electrode 13 and the interconnector 20. In the structure shown in FIG. 11, because the carriers moving to the front electrode 13 are directly transferred to the interconnector 20 through the second conductive particles 164, a current in the structure shown in FIG. 11 more smoothly flows than the structure shown in FIG. 10.

A remaining portion of the second conductive adhesive film 160 not attached to the first portion 13a of the front electrode 13 directly contacts the anti-reflection layer 15 on the emitter layer 12.

The second conductive adhesive film 160 may have a thickness T4 greater than a protruding thickness T3 of the front electrode 13, so that the second conductive adhesive film 160 and the interconnector 20 are sufficiently attached to each other. In this instance, because a front surface of the second conductive adhesive film 160 is a flat surface, the second conductive adhesive film 160 and the interconnector 20 are sufficiently attached to each other.

Because a thickness of the front electrode 13 is generally equal to or less than about 15 μm, the protruding thickness T3 of the front electrode 13 is less than about 15 μm. Thus, the thickness T4 of the second conductive adhesive film 160 may be about 15 μm to 60 μm based on specifications of the solar cell to apply to the solar cell panel.

Further, as shown in FIG. 12, the second conductive adhesive film 160 may have a height difference. The adjacent second conductive particles 164 may be physically contact one another, so that the carriers moving to the front electrodes 13 are sufficiently transferred to the interconnector 20. Further, at least two second conductive particles 164 may be positioned on the front electrode 13.

When the second conductive adhesive film 160 has the height difference, the interconnector 20 may have the same height difference as the second conductive adhesive film 160. The interconnector 20 may have a portion, whose surface protrudes, because of the second conductive particles 164.

As shown in FIG. 12, the second conductive particles 164 may be modified into an oval shape because of a pressure applied during the tabbing process. The first and second portions 13a and 13b of the front electrode 13 have the same width W3. Alternatively, the first and second portions 13a and 13b of the front electrode 13 may have different widths.

As shown in FIG. 13, a width W4 of the first portion 13a may be greater than the width W3 of the second portion 13b. When the width W4 of the first portion 13a is greater than the width W3 of the second portion 13b, an adhesive strength between the second conductive adhesive film 160 and the front electrode 13 is improved, and a contact resistance between the second conductive adhesive film 160 and the front electrode 13 decreases. Hence, an output reduction thereof may be prevented or reduced.

The first portion 13a having the width W4 greater than the width W3 of the second portion 13b may be formed for only the front electrodes 13 positioned on predetermined rows, and the first portion 13a having the same width as the second portion 13b may be formed in the front electrodes 13 positioned on remaining rows. For example, as shown in FIG. 13, each of the front electrodes 13 positioned on even-numbered rows may include the first portion 13a having the width W4 greater than the width W3 of the second portion 13b, and each of the front electrodes 13 positioned on odd-numbered rows may include the first portion 13a having the same width as the second portion 13b.

The first portion 13a having the width W4 greater than the width W3 of the second portion 13b may be formed for only the front electrodes 13 positioned on the odd-numbered rows and/or may have various shapes other than the shape shown in FIG. 13. For example, the various shapes may include a triangle or a semicircle.

The first portion 13a is formed in an up-down symmetric manner based on the front electrode 13 and has a predetermined length L3 in a longitudinal direction of the front electrode 13. It is preferable, but not necessary, that the predetermined length L3 of the first portion 13a is equal to or less than a width W5 (refer to FIG. 9) of the second conductive adhesive film 160, so as to improve the adhesive strength between the second conductive adhesive film 160 and the front electrodes 13 and reduce the contact resistance between the second conductive adhesive film 160 and the front electrodes 13.

When the width W5 of the second conductive adhesive film 160 is less than about 1 mm, the contact resistance increases. When the width W5 of the second conductive adhesive film 160 is greater than about 20 mm, the light receiving area decreases. Thus, the width W5 of the second conductive adhesive film 160 may be about 1 mm to 20 mm.

Thus, the predetermined length L3 of the first portion 13a may be properly set within the range of the width W5 of the second conductive adhesive film 160 based on specifications of the solar cell.

Alternatively, as shown in FIG. 14, each of the front electrodes 13 positioned on all of the rows may include the first portion 13a having the width W4 greater than the width W3 of the second portion 13b.

The adjacent first portions 13a may protrude opposite each other. The adjacent first portions 13a may protrude in the same direction.

In the example embodiment, because the front electrode current collector and the back electrode current collector do not need to be formed, the process and the cost required to form the current collectors may be further reduced.

Further, the bowing phenomenon and the damage of the substrate may be prevented or reduced, and the output reduction thereof may be prevented or reduced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell panel comprising:
a plurality of solar cells, each solar cell including a substrate, a first electrode positioned on a first surface of the substrate and a second electrode positioned on a second surface of the substrate that is opposite the first surface of the substrate, the second electrode having a non-bus bar structure including at least one first portion and at least one second portion adjacent to the at least one first portion, and the at least one first portion and the at least one second portion being formed of same material and extending parallel to each other;
a first conductive adhesive film including a first resin and a plurality of first conductive particles dispersed in the first resin, the first conductive adhesive film being positioned on a second surface of the at least one first portion of the second electrode that is opposite a first surface of the at least one first portion of the second electrode that contacts the substrate, and a first surface of the first conductive adhesive film that faces the second electrode entirely contacting at least one of the second surface of the at least one first portion of the second electrode and the second surface of the substrate; and
an interconnector positioned on a second surface of the first conductive adhesive film that is opposite the first surface of the first conductive adhesive film,
wherein the second surface of the substrate disposed between adjacent first portions of the second electrode is entirely covered by the at least one second portion of the second electrode,
wherein the second electrode comprises a high density aluminum layer on the second surface of the substrate and a low density aluminum layer on the high density aluminum layer, the lower density aluminum layer having a lower density than the high density aluminum layer, and
wherein the at least one first portion is made only of the high density aluminum layer and the at least one second portion of the second electrode is made of the high density aluminum layer and the low density aluminum layer.

2. The solar cell panel of claim 1, wherein the interconnector is electrically connected to the at least one first portion of the second electrode through the plurality of first conductive particles.

3. The solar cell panel of claim 1, wherein the at least one first portion directly contacts the first surface of the first conductive adhesive film.

4. The solar cell panel of claim 3, wherein a thickness of the at least one first portion is different from a thickness of the at least one second portion.

5. The solar cell panel of claim 3, wherein a width of the first conductive adhesive film is equal to or less than a width of the at least one first portion, and the first conductive adhesive film does not contact the at least one second portion.

6. The solar cell panel of claim 3, wherein a width of the first conductive adhesive film is greater than a width of the at least one first portion, and a portion of the first conductive adhesive film directly contacts a portion of the at least one second portion.

7. The solar cell panel of claim 3, wherein a thickness of the at least one first portion is equal to a thickness of the at least one second portion.

8. The solar cell panel of claim 3, wherein a length of the at least one first portion is different from a length of the at least one second portion.

9. The solar cell panel of claim 8, wherein the length of the at least one first portion is shorter than the length of the at least one second portion.

10. The solar cell panel of claim 9, wherein a length of the first conductive adhesive film is equal to the length of the at least one first portion.

11. The solar cell panel of claim 9, wherein a length of the first conductive adhesive film is longer than the length of the at least one first portion, and
at least one end of the first conductive adhesive film extends to an outside of the at least one first portion and directly contacts the substrate.

12. The solar cell panel of claim 3, wherein a length of the at least one first portion is equal to a length of the at least one second portion.

13. The solar cell panel of claim 3, wherein the plurality of first conductive particles directly contact at least one of the at least one first portion and the interconnector.

14. The solar cell panel of claim 13, wherein the plurality of first conductive particles directly contact each of the at least one first portion and the interconnector.

15. The solar cell panel of claim 13, wherein the plurality of first conductive particles are electrically connected to one another.

16. The solar cell panel of claim 3, wherein the first resin is positioned between the plurality of first conductive particles and the at least one first portion of the second electrode and between the plurality of first conductive particles and the interconnector.

17. The solar cell panel of claim 16, wherein the plurality of first conductive particles are electrically connected to one another.

18. The solar cell panel of claim 1, wherein the at least one second portion of the second electrode is disposed between the adjacent first portions of the second electrode.

19. The solar panel of claim 1, wherein the each solar cell further includes a back surface field layer entirely covering the second surface of the substrate, and the high density aluminum layers of the at least one first portion and the at least one second portion of the second electrode contact the back surface field layer.

* * * * *